(12) United States Patent
Wang et al.

(10) Patent No.: US 9,324,559 B2
(45) Date of Patent: Apr. 26, 2016

(54) THIN FILM DEPOSITION APPARATUS WITH MULTI CHAMBER DESIGN AND FILM DEPOSITION METHODS

(71) Applicant: Taiwan Semiconductor Manufacturing Co., Ltd., Hsin-Chu (TW)

(72) Inventors: Lan Hai Wang, Zhubei (TW); Ding-I Liu, Hsinchu (TW); Si-Wen Liao, Hsinchu (TW); Po-Hsiung Leu, Lujhu Township (TW); Yong-Hung Yang, Hsinchu (TW); Chia-Ming Tai, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 118 days.

(21) Appl. No.: 13/923,390

(22) Filed: Jun. 21, 2013

(65) Prior Publication Data

US 2014/0377961 A1   Dec. 25, 2014

Related U.S. Application Data

(60) Provisional application No. 61/789,817, filed on Mar. 15, 2013.

(51) Int. Cl.
*H01L 21/02* (2006.01)
*C23C 16/44* (2006.01)
*C23C 16/455* (2006.01)

(52) U.S. Cl.
CPC ...... *H01L 21/02271* (2013.01); *C23C 16/4401* (2013.01); *C23C 16/4412* (2013.01); *C23C 16/45508* (2013.01); *C23C 16/45565* (2013.01); *C23C 16/45574* (2013.01)

(58) Field of Classification Search
None
See application file for complete search history.

(56) References Cited

U.S. PATENT DOCUMENTS

| | | | | |
|---|---|---|---|---|
| 2003/0188682 | A1* | 10/2003 | Tois et al. | 117/105 |
| 2003/0207591 | A1* | 11/2003 | Lu et al. | 438/770 |
| 2004/0007176 | A1* | 1/2004 | Janakiraman et al. | 118/715 |
| 2007/0065594 | A1* | 3/2007 | Chiang et al. | 427/533 |
| 2009/0197356 | A1* | 8/2009 | Bang et al. | 438/14 |
| 2013/0256260 | A1* | 10/2013 | Bhowmik et al. | 216/27 |

* cited by examiner

*Primary Examiner* — Joseph Miller, Jr.
(74) *Attorney, Agent, or Firm* — Duane Morris LLP

(57) ABSTRACT

A multi chamber thin film deposition apparatus and a method for depositing films, is provided. Each chamber includes a three dimensional gas delivery system including process gases being delivered downwardly toward the substrate and laterally toward the substrate. A pumping system includes an exhaust port in each chamber that is centrally positioned underneath the substrate being processed and therefore the gas flow around all portions of the edge of the substrate are equally spaced from the exhaust port thereby creating a uniform gas flow profile which results in film thickness uniformity of films deposited on both the front and back surfaces of the substrate. The deposited films demonstrate uniform thickness on the front and back of the substrate and extend inwardly to a uniform distance on the periphery of the backside of the substrate.

17 Claims, 5 Drawing Sheets

THIN FILM DEPOSITION APPARATUS WITH MULTI CHAMBER DESIGN AND FILM DEPOSITION METHODS

RELATED APPLICATION

The application claims priority to U.S. Provisional Patent Application No. 61/789,817, entitled THIN FILM DEPOSITION APPARATUS WITH MULTI CHAMBER DESIGN AND FILM DEPOSITION METHODS, filed Mar. 15, 2013, the contents of which are hereby incorporated by reference as if set forth in their entirety.

TECHNICAL FIELD

The disclosure relates to semiconductor manufacturing apparatuses and methods and, more particularly, to apparatuses and methods for film deposition on substrates used in semiconductor manufacturing.

BACKGROUND

In today's rapidly advancing semiconductor manufacturing industry, device features continue to shrink and levels of integration continue to increase. Increasingly larger substrates are being used for semiconductor manufacturing. Hundreds or even thousands of individual integrated circuits, i.e. "chips", are formed on these substrates and as the substrate sizes and integration levels continue to increase, more and more semiconductor integrated circuits are being formed on each substrate. In order to accommodate the fabrication of increasingly smaller features on substrates of increasingly larger sizes, the uniformity of film thickness for a film deposited on a substrate, is required to be very high. In other words, the tolerances for film thickness uniformity across a substrate are necessarily very tight and it more challenging and more important to achieve good thickness uniformity across substrates as substrates become larger.

It is also desirable to reduce contamination during or after film deposition.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a method and system for depositing thin films on substrates in the semiconductor manufacturing industry and other substrates used in other industries. Although generally described in conjunction with semiconductor manufacturing and the substrates used in semiconductor manufacturing, this description is intended to be illustrative and not limiting of the disclosure which is not limited to semiconductor manufacturing technology.

It is important to prevent contamination of semiconductor or other devices during their manufacture. With feature sizes decreasing, smaller and smaller particles can create defects that destroy device functionality. Various film deposition methods are used in semiconductor manufacturing and many of these methods result in the intentional or unintentional deposition of a film on the backside of the substrate in addition to the intended film deposition that occurs on the front side of the substrate. One contamination issue caused by chipping and cracking of a film on the substrate backside near the edge of the substrate is created by poor coverage of an SiN film by a non-uniform oxide film at the edge. This leads to the SiN film being removed and eventually leads to peeling of HK (High-k dielectric) or other films formed over portions of the substrate not covered by SiN.

The disclosure provides an apparatus with a multi chamber design and film deposition takes place in the chambers simultaneously in some embodiments. In some embodiments, the deposition method is CVD, chemical vapor deposition. In CVD, deposited species are formed as a result of chemical reaction between gaseous reactants at elevated temperatures in the vicinity of the substrate. The film is deposited as a solid product of the reaction on the surface of the substrate. Various types of CVD operations are carried out according to the method and the multi chamber apparatus of the disclosure. The types of CVD methods include but are not limited to atmospheric pressure chemical vapor deposition, APCVD, low pressure chemical vapor deposition, LPCVD, metal organic chemical vapor deposition, MOCVD, and plasma enhanced chemical vapor deposition, PECVD. Various film types are formed using the methods and apparatus of the disclosure. The film types include oxides and other dielectric films, semiconductor films such as crystalline or amorphous silicon, metals including conductive metals and barrier-type metals and various other films used in semiconductor device manufacturing.

Figure 1:
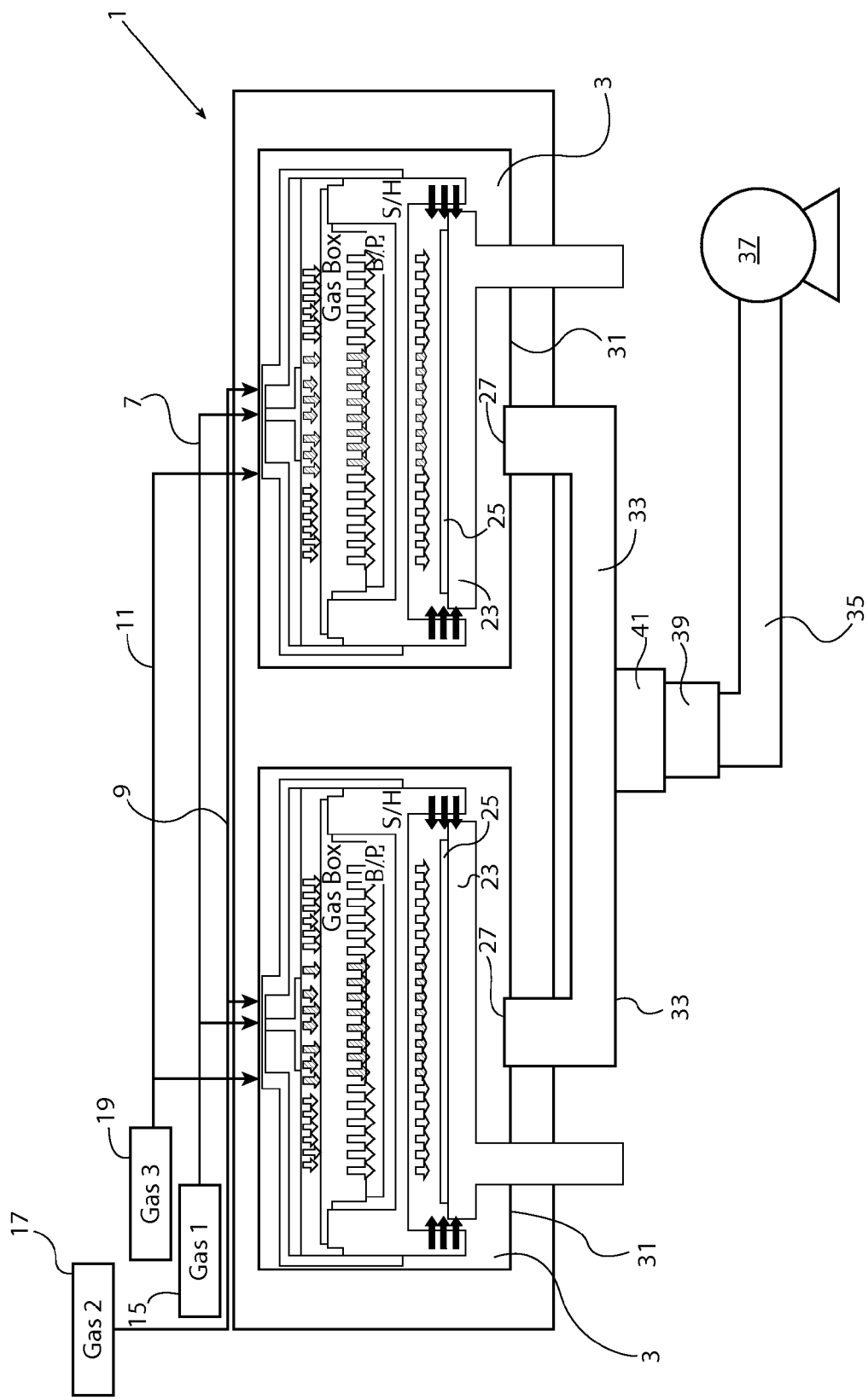
FIG. 1 is a side, cut-away view of a film deposition apparatus according to some embodiments of the disclosure.

FIG. 1 is a side, cut-away view showing a twin-chamber deposition apparatus used according to some embodiments of the disclosure. Film deposition apparatus 1 includes two process chambers 3 in the illustrated embodiment of FIG. 1. Each process chamber 3 includes a three-dimensional gas delivery system and an exhaust port centrally disposed underneath the substrate and at the bottom of each process chamber 3. The exhaust ports are coupled to a pumping system which may be a common pumping system. These will be described in further detail below. In other embodiments, film deposition apparatus 1 includes additional process chambers 3 and each process chamber 3 includes the gas delivery and distribution system as will be described and each process chamber 3 also includes the centrally disposed exhaust port disposed underneath the substrate upon which the film deposition occurs. In the illustrated embodiment, there are three gases (gas 1, gas 2 and gas 3) delivered to each process chamber 3 but this is intended to be exemplary only and in other embodiments, more or fewer gas species are delivered to each process chamber 3. Gas 1 is delivered by gas 1 line 7, gas 2 is delivered by gas 2 line 9 and gas 3 is delivered by gas 3 line 11. The respective gas lines are supplied by gas 1 source 15, gas 2 source 17 and gas 3 source 19. Various gas sources are used in various embodiments.

Each process chamber 3 includes a centrally positioned heater plate 23 that serves as a chuck, substrate stage or other substrate receiving member. Substrate 25 is received on a substrate receiving surface of heater plate 23 in the illustrated embodiment. Substrate 25 is a silicon wafer in some embodiments and substrate 25 is formed of other materials such as silicon germanium, that are used as substrates in the semiconductor device manufacturing industry, in other embodiments. Substrate 25 may also be a substrate used in industries other than semiconductor manufacturing, in other embodiments. Film deposition apparatus 1 is sized to accommodate and process substrates 25 having various sizes in various embodiments. In some embodiments, substrates 25 include a diameter of 300 mm or 450 mm but other sizes are used in other embodiments. In some embodiments, substrates 25 are round in shape and include a front surface upon which semiconductor devices are formed, and a back surface. Substrates 25 also have lateral edges. In such embodiments, heater plate 23 is generally round in shape to accommodate substrate 25 and each process chamber 3 is generally round in shape along the direction orthogonal to the plane of the drawing figure.

In various embodiments, substrate 25 is at various stages in the device fabrication sequence, and various different films are formed on substrate 25 using the methods of the disclosure, in various embodiments. Each chamber 3 includes exhaust port 27 centrally disposed underneath substrate 25 and heater plate 23 and fluidly coupled to the pumping system. Exhaust port 27 is positioned in the bottom of each process chamber 3 and in the illustrated embodiment, exhaust port 27 is located on bottom surface 31 of process chamber 3. The central location of exhaust ports 27 provide a uniform gas flow and uniform gas velocities around the periphery of substrate 25 and heater plate 23 because exhaust port 27 is generally positioned about equidistant from all portions of the respective circumferential edges of substrate 25 and heater plate 23. The uniform gas flow and uniform gas velocities around the periphery of substrate 25 improve deposition uniformity near the edges on the back surface of substrate 25.

Process chambers 3 are exhausted through exhaust ports 27 by a single, common pumping system in the illustrated embodiment. Exhaust conduits 33 terminate at exhaust ports 27 and are each also coupled to common pumping line 35. Pump 37 pumps each process chamber 3 through pumping line 35, exhaust conduits 33, and exhaust ports 27. The pumping system includes throttle valve 39 and isolation valve 41 in the illustrated embodiment but other valves are used in other embodiments. Various suitable pumps are used as pump 37 in various embodiments. In some embodiments, each process chamber 3 has its own dedicated pump.

Figure 2:
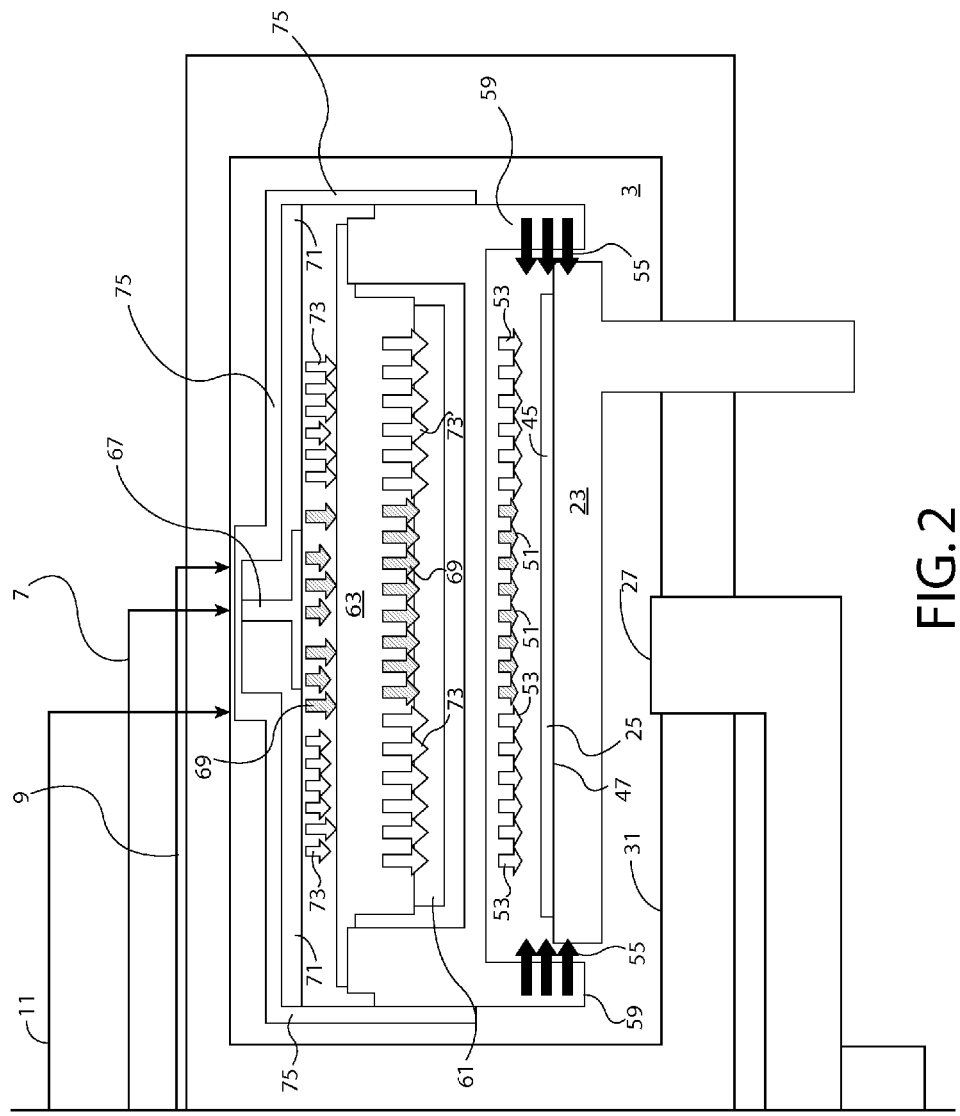
FIG. 2 is an exploded view of a portion of FIG. 1.

Further details of the gas distribution system are shown in FIG. 2 which is an exploded view of part of FIG. 1. Portions of the film deposition apparatus shown in FIG. 1 are not shown in FIG. 2, e.g. the top portion of process chamber 3, in order to identify the various described components in detail.

FIG. 2 shows the delivery of gas 1 through gas 1 line 7, the delivery of gas 2 through gas 2 line 9 and the delivery of gas 3 through gas 3 line 11. Various different gas distribution systems are used in various embodiments to direct the processing gases to substrate 25. Substrate 25 includes front surface 45 and back surface 47 and peripheral edges. Deposition occurs on front surface 45 due to the reaction between the various gases directed to surface 25. Various components can be used in combination to deliver multiple processing gases to substrate 25. First processing gas 51 (indicated by arrows) is delivered to substrate 25 from gas 1 line 7; second processing gas 53 (indicated by arrows) is delivered to substrate 25 from gas 2 line 9 and third processing gas 55 (indicated by arrows) is delivered to substrate 25 from gas 3 line 11. Each of the arrows associated with first processing gas 51, second processing gas 53, and third processing gas 55 is indicative of gas flow from gas delivery ports at the indicated location, i.e. the arrows point in the direction of the gas flow, according to convention. The gas flows are controlled by mass flow controllers (not shown) associated with each of the gas lines, in conjunction with a controller. First processing gas 51 and second processing gas 53 are directed downwardly toward substrate 25. First processing gas 51 is delivered at a central location over substrate 25 and second processing gas 53 peripherally surrounds the delivery location of first processing gas 51, over substrate 25. Third processing gas 55 is directed laterally toward substrate 25 from gas delivery ports that are laterally disposed with respect to substrate 25 and are at about the same vertical location as substrate 25. Various showerheads, gas delivery plates and gas boxes are used in various embodiments to direct gas 1, gas 2, and gas 3 to substrate 25 in the three dimensional orientation shown.

Showerhead 59, block plate 61 and gas box 63 are used in combination as a gas distribution system to direct the gases from gas 1 line 7, gas 2 line 9 and gas 3 line 11, to substrate 25 as first processing gas 51, second processing gas 53 and third processing gas 55, respectively. Block plate 61 and gas box 63 distribute three or several gas flows in some embodiments. Various other gas distribution plates and systems are used in other embodiments.

Gas 1 flows in gas 1 conduit 67 and is indicated by gas flow arrows 69 and delivered as first processing gas 51. Gas 2 flows within gas conduit 71 and is indicated by gas flow arrows 73 and delivered as second processing gas 53. Gas 3 flows within gas 3 conduit 75 and is delivered as third processing gas 55. The details of the gas delivery system are exemplary only and other gas delivery systems are used in other embodiments. An aspect of the disclosure is the delivery of first processing gas 51 downwardly from a central location above substrate 25, the delivery of second processing gas 53 downwardly from above substrate 25 at locations that surround first processing gas 51 and the delivery of third processing gas 55 laterally directed toward substrate 25 from a side location. In other embodiments, other three dimensional gas delivery orientations are used and according to these other embodiments, one or more gases may be directed downwardly towards substrate 25, one or more gases may be directed laterally toward substrate 25 and one or more gases may be directed at an obtuse angle toward front surface 45 of substrate 25. The three dimensional gas delivery system including gases directed downwardly and laterally toward substrate 25, improves deposition uniformity, particularly at the edge of the back surface of substrate 25.

Various processing gases are used in various embodiments and various relative amounts of processing gases are delivered as first processing gas 51, second processing gas 53 and third processing gas 55 in various embodiments. In one embodiment, first and second processing gases 51, 53 include about 85-95 percent of the total gas flow and third gas flow 55 provides about 5-15 percent of total gas flow but other relative amounts are used in other embodiments.

With the three gases delivered as indicated in FIGS. 1 and 2, the pressure in process chamber 3 is controlled by a pressure controller and the temperature of substrate 25 is controlled by heater plate 23 to enable the gases to react and chemical vapor deposition to take place. The apparatus includes various controls, controllers and hardware that enables each process chamber 3 to carry out various types of chemical vapor deposition (CVD) operations using various gases and various deposition conditions. One of the process controls is various mass flow controllers used to control the gas flows of each of the gases delivered to process chamber 3. The aforedescribed pumping system also controls the pressure as well as the gas flow rates. Pump 37 and the exhaust system described above are pumping process chambers 3 through exhaust port 27 during the deposition operation. As above, the chemical vapor deposition is APCVD or LPCVD or PECVD or MOCVD or other chemical vapor deposition methods in various embodiments. According to the PECVD embodiment and other embodiments, a plasma is generated and controlled within process chamber 3. Various plasma generation systems and various electrode configurations are used in various embodiments to produce and control the plasma. Various films are formed and deposited on substrate 25 such as oxides, oxynitrides, nitrides, semiconductor films, metal films or various other films used in semiconductor manufacturing. In one embodiment, a high aspect ratio process (HARP) oxide for use as STI (shallow trench isolation) structures is deposited and according to another embodiment, various high-k dielectric films are deposited. Various different gases are used to form the films. According to one embodiment in which three processing gases are used to chemically react and form a solid film that deposits on substrate 25, any of the three gases may be delivered through any of the various gas lines. For example, third processing gas 55 may represent any of the three processing gases used in combination to deposit a film.

In various embodiments, a film is formed on front surface 45 of substrate 25. The three-dimensional gas delivery system in combination with the central location of exhaust port 27 provides a uniform film formed on front surface 45 of substrate 25. In various embodiments, processing conditions also form a film on back surface 47 of substrate 25. The aforementioned aspects of the disclosure combine to deposit a film on back surface 47 that also has uniform thickness and extends inwardly to a uniform distance around the periphery of the edge of substrate 25. The deposited film is therefore resistant to chipping and cracking especially during subsequent handling, as a result of the superior uniformity.

Figure 3:
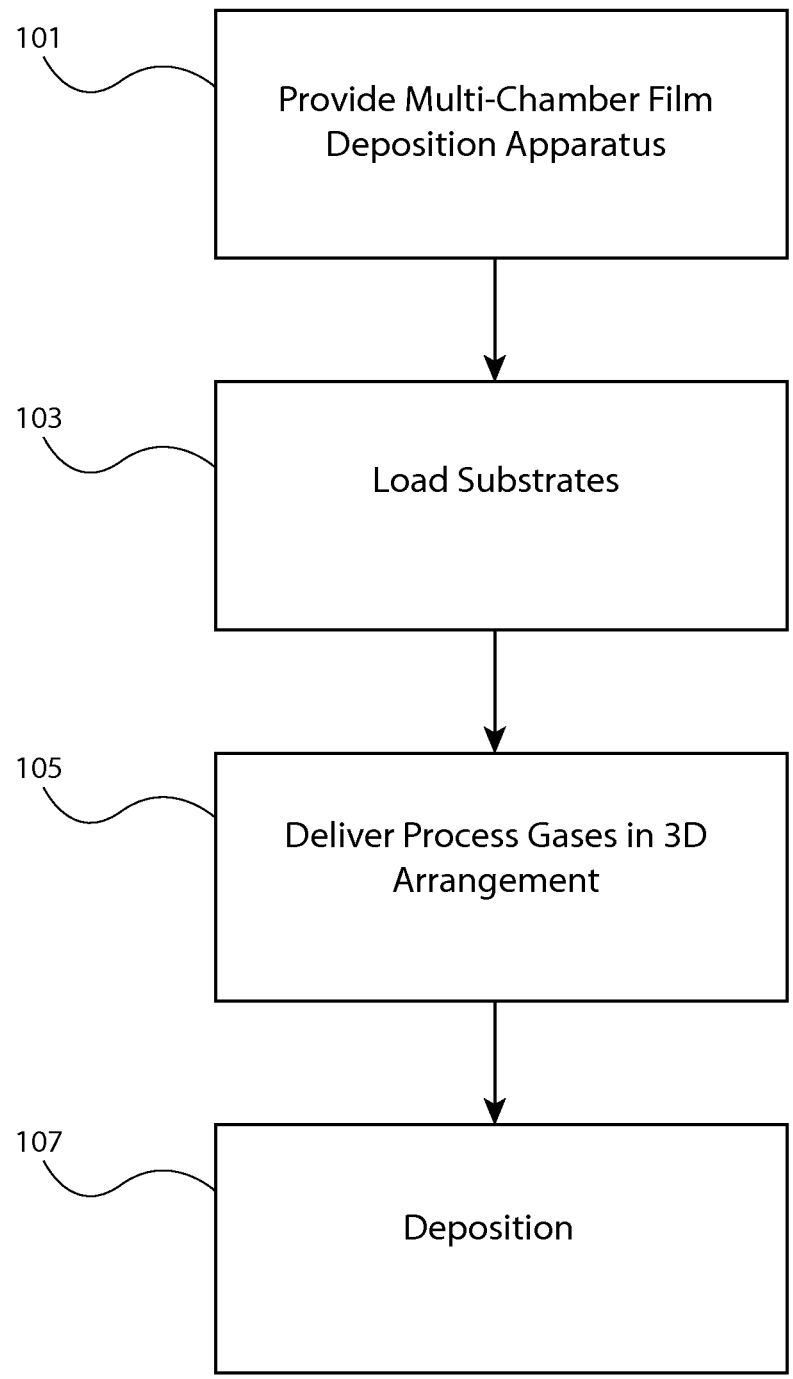
FIG. 3 is a flowchart illustrating a film deposition method according to the disclosure.

FIG. 3 is a flowchart illustrating a method for film deposition according to the disclosure. The apparatus described above is provided at provide multi-chamber film deposition apparatus operation 101 and the apparatus can be a twin chamber apparatus or an apparatus with more than two processing chambers. At load substrates operation 103, the substrates are provided onto the respective substrate stages which may be heater plates such as heater plate 23 of FIGS. 1 and 2. At deliver process gases in 3D arrangement operation 105, multiple process gases are delivered such as shown in FIGS. 1 and 2. During this operation 105, each process chamber is exhausted through a centrally disposed exhaust port that is positioned underneath the substrate. It should be understood that the exhaust operation involves the removal of gaseous species from the process chambers through the associated exhaust ports such as exhaust ports 27 shown in FIGS. 1 and 2. The pumping of the chamber through exhaust port 27 also takes place during processing in delivery process gases in 3D arrangement operation 105 and also after the processing operation is complete. The pressure, temperature and power within the processing chambers are also controlled during deliver process gases in 3D arrangement operation 105. At deposition operation 107, a uniform film is deposited on the top surface of the substrate and also on the bottom surface of the substrate in some embodiments. At deposition operation 107, the process gases are still being delivered as in deliver process gases in 3D arrangement operation 105, the system is being exhausted and process controls are still being carried out such as described in conjunction with deliver process gases in 3D arrangement operation 105.

The described aspects of the apparatus and gas distribution method and system provide for superior film uniformity on the front side and backside of various substrates for various film deposition processes.

Figure 4:
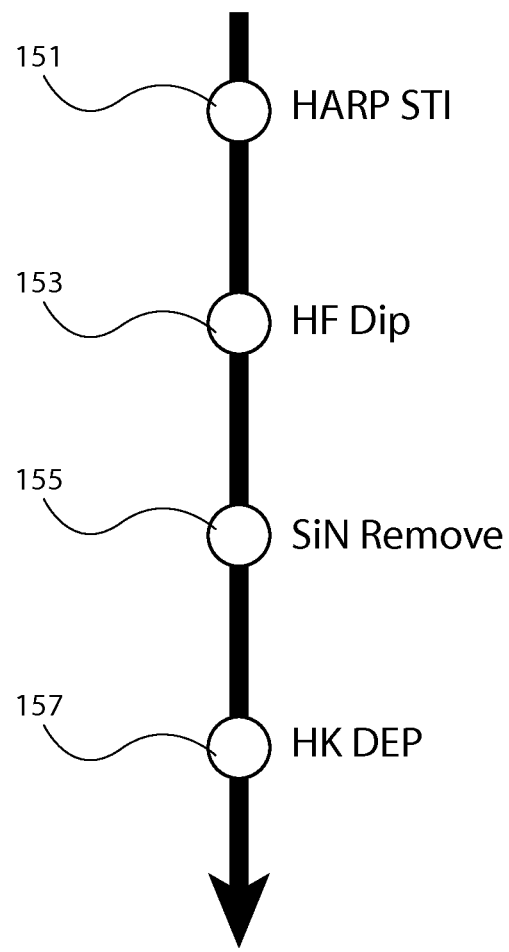
FIG. 4 is a flowchart illustrating a semiconductor manufacturing processing method according to an embodiment of the disclosure.

In one embodiment, the methods and apparatus of the disclosure are used to carry out a semiconductor manufacturing process including the process sequence shown in FIG. 4. FIG. 4 shows HARP STI deposition operation 151 and this high aspect ratio process deposition may be carried out using the apparatus and gas flow aspects according to the disclosure to form an oxide or other dielectric film for use as an STI (shallow trench isolation) structure on the front side of a substrate in one embodiment. In some embodiments, the substrate includes a nitride film disposed on its front and back surfaces prior to the deposition of the oxide or other dielectric film. The methods and apparatus of the disclosure provide an STI oxide layer on front surface 45 of substrate 25 (see FIG. 2) and also produce a uniform film around the wafer edges on back surface 47 (see FIG. 2) of substrate 25. Due to the apparatus and gas flow distribution method and arrangements of the disclosure, the film deposition on back surface 47 is uniform in thickness as is the width of the deposited film, i.e. the lateral extent of the film from the edge of the substrate, as will be shown in FIGS. 5A-5D.

At HF dip operation 153, the substrate is dipped in an HF, hydrofluoric acid solution to remove oxide from the substrate but in some embodiments oxide remains around the edge of the underside of the substrate. Remove operation 155 removes SiN, silicon nitride, from the backside of the substrate except for areas covered by an oxide. A high-k dielectric, HK, is deposited at "HK dep" operation 157 which involves the deposition of a high-k dielectric material on the front side and backside of the substrate. The HK deposition process is carried out using the apparatus and gas flow distribution methods according to the disclosure in some embodiments. Due to the presence of a uniform nitride film around the edge of the substrate as a result of the uniform oxide layer deposited in the HARP STI operation 151, the extent of the HK (high-k) dielectric film on the underside of the substrate is controlled so that it is deposited on the nitride around the edge of the substrate but does not encroach inwardly past the nitride layer and therefore the peeling and cracking associated with the HK material being deposited directly on other materials on back surface 47 of substrate 25, is avoided. In some embodiments, the nitride layer extends inwardly to an average distance of about 3 mm or less, around the periphery of the substrate. The high-k dielectric film deposited on the nitride around the edge of the substrate extends inwardly to an average distance of about 2.5 mm in some embodiments but other average distances are used in other embodiments.

FIGS. 5A-5D illustrate aspects of the process described in conjunction with FIG. 4. The three-dimensional gas delivery system in combination with the central location of the exhaust port of the disclosure provides superior uniformity for a film deposited on the front and back surfaces of various substrates such as substrate 201 shown in FIGS. 5A-5D. The aforementioned aspects of the disclosure combine to deposit a film on back surface 203 of substrate 201 that has uniform thickness and also extends inwardly to a distance that is uniform around the periphery of back surface 203. The uniform, deposited film is resistant to chipping and cracking especially during subsequent handling, as a result of the superior uniformities. The described aspects of the apparatus and gas distribution method and system provide for superior film uniformity on the front and back surfaces of substrates and for various film deposition processes and is not intended to be limited to the embodiment illustrated in FIGS. 5A-5D on substrate 201.

Figure 5A:
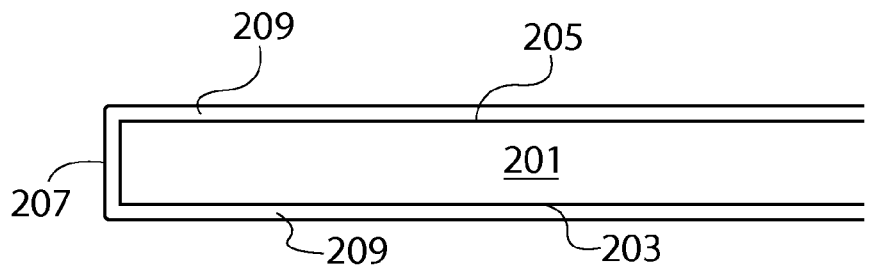
FIGS. 5A-5D are cross-sectional views showing a sequence of processing operations according to the disclosure.

FIG. 5A shows substrate 201 with back surface 203 on the underside of substrate 201, and top surface 205. Top surface 205 is the surface upon which semiconductor devices are being fabricated. Substrate 201 includes a periphery defined by outer edge 207. In some embodiments, one or more of various films are formed on the back surface of substrate 201 and back surface 203 represents the surface of one of the films which may be prone to cracking or peeling. In one embodiment, back surface 203 represents a polysilicon film surface. In other embodiments, back surface 203 represents the back surface of substrate 201 itself. Nitride, SiN layer 209 is formed on back surface 203. In some embodiments such as shown in FIG. 5A, nitride, SiN layer 209 is also disposed on top surface 205 and on outer edge 207, but in other embodiments, SiN layer 209 is absent from top surface 205 and outer edge 207.

Figure 5B:
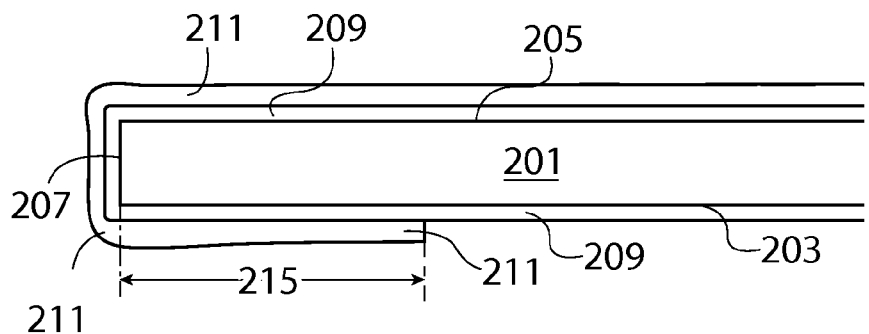

FIG. 5B shows oxide 211 formed on nitride layer 209 and extending inwardly from outer edge 207 of substrate 201 on the underside of substrate 201. Oxide 211 is an HARP STI oxide formed using the apparatus and methods of the disclosure and is also formed on and throughout top surface 205 and on outer edge 207. Oxide 211 is formed around the periphery of back surface 203 of substrate 201 and extends inwardly to width 215. An aspect of the three-dimensional gas delivery system in combination with the central location of the exhaust port of the disclosure is that oxide 211 is relatively uniform in thickness and width 215 is relatively uniform around the entire periphery of the underside of substrate 201. In some embodiments, width 215 of oxide 211 does not vary more than about 10-15 percent around the periphery of substrate 201. In some embodiments, width 215 includes an average of about 3 millimeters around back surface 203 of substrate 201 but other widths are achieved in other embodiments. Width 215 is various other dimensions in other embodiments. In some embodiments, oxide 211 is formed using an HARP STI process 151 with a process temperature of about 500-600° C. and in which about 5-15 percent of the overall gas flow is provided by third processing gas 55 (see FIG. 2) and the balance of the process gasses are delivered as first processing gas 51 and second processing gas 53 but other portions of the overall gas flow are provided as third processing gas 55 and other embodiments. Even at the elevated temperatures indicated, oxide 211 is uniform in thickness as indicated by width 215, the extent to which oxide 211 extends inwardly from outer edge 207 of substrate 201.

Figure 5C:
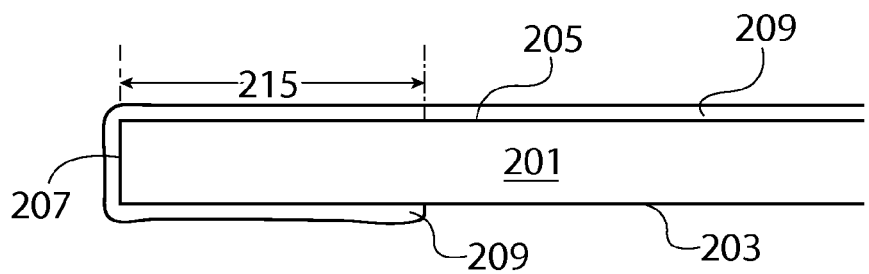

FIG. 5C shows the substrate after an ODR HF dip process and subsequent SiN removal operation is carried out. Some or all of oxide 211 is removed in the ODR HF dip process 153 described above but in some embodiments, the thickness of oxide 211 is chosen such that a portion of its thickness remains after the HF dip. A nitride removal operation is then carried out to remove the nitride not covered by oxide 211 and the SiN remove operation 155 also includes an over etch that essentially removes all of oxide 211 from over nitride layer 209 to produce the structure shown in FIG. 5C with nitride layer 209 remaining substantially throughout the area defined by width 215. Due to the thickness uniformity of oxide 211, the portions of nitride layer 209 remaining, also have a uniform thickness and nitride layer 209 is void of cracks. Nitride layer 209 also remains on top surface 205 and on outer edge 207 in some embodiments, as illustrated in FIG. 5C, but may be absent from top surface 205 and outer edge 207 in other embodiments.

Figure 5D:
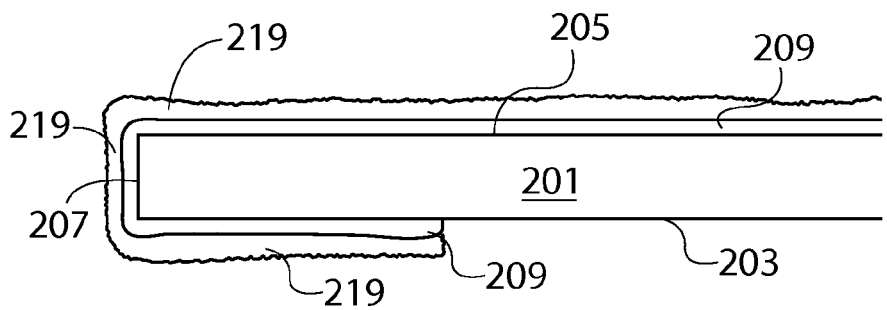

FIG. 5D shows the structure of FIG. 5C after high-k dielectric film 219 has been formed on nitride layer 209 on the underside of substrate 201. High-k dielectric film 219 is also formed on top surface 205 and along outer edge 207 of substrate 201. In some embodiments, the high-k dielectric film 219 is formed in a high-k deposition process using atomic layer deposition (ALD) techniques. In one embodiment, $HfCl_4$ is used as a precursor gas to form an HfO high-k dielectric film but in other embodiments, other high-k dielectric films are formed and other gases are used as precursor gases. In other embodiments, high-k dielectric film 219 may be hafnium silicate, zirconium silicate, zirconium dioxide or other suitable high-k dielectrics formed using ALD (atomic layer deposition) or other suitable methods. In some embodiments, the high-k deposition process includes a temperature of about 200-400° C. but other temperatures are used in other embodiments. In some embodiments, additional carrier gases such as $N_2$ or other suitable gases are used.

The high-k dielectric film 219 is deposited to extend inwardly to an extent no greater than width 215. In the illustration of FIG. 5D, high-k dielectric film 219 extends throughout width 215 but in other embodiments, high-k dielectric film 219 extends to a lesser degree inwardly from outer edge 207. In one embodiment, width 215 may be an average of about 3 mm around the periphery of a substrate and high-k dielectric film 219 may extend inwardly to an average width of about 2.5 mm or less around the periphery. According to various embodiments, the high-k dielectric film 219 is formed on nitride layer 209 and does not extend inwardly past nitride layer 209 on the underside of substrate 201 due in part to the uniform width of nitride layer 209 around the periphery of substrate 201 which in turn, is due the uniformity of oxide 211 due to the methods and apparatus of the disclosure. Due to these factors and also due to the thickness uniformity and lack of voids in nitride layer 209, high-k dielectric film 219 is formed on nitride layer 209 and does not deposit on back surface 203 which represents other films that are prone to cracking and peeling when a high-k dielectric film is deposited on them.

According to one aspect, an apparatus for thin film deposition is provided. The apparatus comprises a plurality of process chambers, each including a substrate stage therein. Each substrate stage is for retaining a substrate thereon. The apparatus also comprises a pumping system. Each process chamber includes an exhaust port that exhausts to the pumping system and each exhaust port is centrally disposed underneath the substrate stage. For each process chamber, a plurality of gas inlet delivery ports is included. The plurality of gas inlet delivery ports includes first gas inlet delivery ports centrally positioned over the substrate stage, second gas inlet delivery ports positioned laterally surrounding the first gas inlet delivery ports and over the substrate stage, and third gas inlet delivery ports located laterally adjacent to the substrate stage.

In some embodiments, the third gas inlet delivery ports are located at about the same vertical position as an upper substrate-receiving surface of the corresponding substrate stage.

In some embodiments, the first gas inlet delivery ports deliver a first processing gas to the associated process chamber, the second gas inlet delivery ports deliver a second processing gas to the associated process chamber and the third gas inlet delivery ports deliver a third processing gas to the associated process chamber.

In some embodiments, the plurality of process chambers comprises two process chambers and each process chamber is a thin film deposition chamber that includes controls, hardware and a plasma generation system that enables the process chamber to carry out chemical vapor deposition (CVD) and plasma enhanced chemical vapor deposition (PECVD).

In some embodiments, each process chamber includes a showerhead that includes the first gas inlet delivery ports, the second gas inlet delivery ports and the third gas inlet delivery ports and a plurality of gas receiving ports. The plurality of gas receiving ports include a first gas receiving port for receiving a first gas and is fluidly coupled to the first gas inlet delivery ports, a second gas receiving port for receiving a second gas and is fluidly coupled to the second gas inlet delivery ports and a third gas receiving port for receiving a third gas and is fluidly coupled to the third gas inlet delivery ports.

In some embodiments, the exhaust ports are coupled to a common exhaust conduit and a common pumping line coupled to the pumping system.

Some embodiments further comprise a gas distribution plate in each process chamber, each gas distribution plate including at least three different gas flow conduits.

In some embodiments, the first and second gas inlet delivery ports direct gas downwardly and the third gas inlet delivery ports directs gas laterally.

In some embodiments, each substrate stage is centrally positioned within the associated process chamber and includes heating elements therein.

In some embodiments, the first gas delivery inlet ports are coupled to a first gas source, the second gas inlet delivery ports are coupled to a second gas source, the third gas inlet delivery ports are coupled to a third gas source and each process chamber includes a pressure controller, a heater and a plasma generation system.

According to another aspect, a method for forming a semiconductor device is provided. The method comprises: providing a semiconductor substrate with at least one film formed on a backside thereof, the at least one film including an outermost nitride layer; disposing the backside of the substrate on a chuck in a film deposition apparatus; depositing a film on an opposed front surface of the substrate by delivering at least a duality of gases downwardly toward the front surface of the substrate and at least a gas directed laterally toward an outer edge of the substrate, the depositing further comprising depositing the film on a periphery of the backside of the substrate, the film on the backside extending inwardly from the outer edge to a distance that varies less than about 15 percent around the periphery of the substrate.

In some embodiments, the depositing comprises atomic layer deposition.

In some embodiments, the film comprises an oxide.

In some embodiments, the oxide comprises an STI oxide and the depositing comprises a high aspect ratio deposition process.

Some embodiments further comprise using the film on the backside as a mask and removing the at least one film from the backside of the substrate in locations other than the periphery.

Some embodiments further comprise removing the film from the backside after the removing the at least one film.

Some embodiments further comprise, after the removing the film from the backside, depositing a high-k dielectric film using a further deposition process that deposits the high-k dielectric film on the front surface and on the periphery of the backside of the substrate.

In some embodiments, the depositing a high-k dielectric film deposits the high-k dielectric film on no other portions of the backside of the substrate. In some embodiments, the distance includes an average of less than about 3 millimeters around the periphery and the high-k dielectric film extends inwardly from the outer edge on the backside of the substrate to an average distance of less than about 2.5 mm around the periphery of the substrate.

In some embodiments, the depositing takes place in a first deposition chamber of the film deposition apparatus that includes further deposition chambers, each of the first deposition chamber and each the further deposition chamber having an exhaust port disposed centrally beneath the corresponding substrate and further comprising exhausting the first deposition chamber and the further deposition chambers through the respective exhaust ports using a common pumping system.

According to another aspect, a method for depositing film on substrates is provided. The method comprises: providing a multi chamber film deposition apparatus with a common pumping system; and, in each the chamber: providing a substrate on a substrate stage, delivering gases to the chamber through a plurality of gas delivery ports, the plurality of gas delivery ports including first gas delivery ports centrally located over the substrate, second gas delivery ports peripherally surrounding the first gas delivery ports and located above the substrate and third gas delivery ports located laterally adjacent side edges of the substrate, exhausting the chamber using the common pumping system that exhausts the chamber through an exhaust port centrally disposed underneath the substrate stage, and depositing a film on a front surface and on a peripheral portion of a back surface of the substrate using the gases and chemical vapor deposition (CVD).

Some embodiments further comprise heating each substrate and wherein the CVD comprises one of metal organic CVD (MOCVD), plasma enhanced CVD (PECVD), low pressure CVD (LPCVD), and atmospheric pressure CVD (APCVD).

In some embodiments, in each chamber, the film is an oxide film, and the oxide film on the peripheral portion, extends inwardly from an outer edge of the substrate to a distance that varies less than 15% around the peripheral portion of the back surface of the substrate.

In some embodiments, in each chamber, the substrate stage includes a heater therein and the delivering includes the first gas delivery ports delivering a first gas species downwardly toward the substrate, the second gas delivery ports delivering a second gas species downwardly toward the substrate and the third gas delivery ports delivering a third gas species laterally toward the substrate.

In some embodiments, in each chamber, the film is an oxide film and the back surface of the substrate includes at least one film thereon, the at least one film including an outermost nitride layer, further comprising using the oxide film on the peripheral portion as a mask and removing the at least one film from the backside of the substrate in locations other than the periphery and further comprising removing the oxide film from the backside.

Some embodiments further comprise, after removing the oxide film from the backside, depositing a high-k dielectric film using a further deposition process that deposits the high-k dielectric film on the front surface and on the peripheral portion of each the back surface of each the substrate in each the chamber.

According to another aspect, a device comprises a semiconductor substrate with a front surface, back surface and outer edge. The front surface has semiconductor structures and materials formed thereon and includes a first film disposed thereon, the back surface comprises at least one layer covering substantially all of the back surface and further including the first film formed on a periphery of the back surface and covering the at least one layer, the first film extending inwardly from the outer edge to a distance that varies less than about 15 percent around the periphery of the back surface of the substrate.

In some embodiments, the at least one layer includes an outermost nitride layer, the first film comprises an oxide and the oxide fills shallow trench isolation (STI) structures on the front surface.

In some embodiments, the first film extends inwardly from the outer edge to the distance having an average value of about 3 millimeters and further comprising a high-k dielectric film disposed over the first film on the front surface and disposed on the back surface only on the periphery.

In some embodiments the high-k dielectric film extends inwardly from the outer edge on the backside of the substrate to an average distance of less than about 2.5 mm around the periphery of the substrate.

According to another aspect, an apparatus for thin film deposition comprises: a plurality of process chambers, each including a centrally disposed substrate stage therein, each substrate stage configured to retain a substrate thereon; a common pumping system, each process chamber including an exhaust port that exhausts through a common exhaust conduit and to the common pumping system, each exhaust port centrally disposed underneath the substrate stage; and for each process chamber, a plurality of gas inlet delivery ports including first gas inlet delivery ports centrally positioned over the substrate stage, second gas inlet delivery ports positioned laterally surrounding the first gas inlet delivery ports and over the substrate stage, and third gas inlet delivery ports located laterally adjacent the substrate stage.

In some embodiments, each process chamber includes a pressure controller, a heater and a plasma generation system; and each process chamber includes the first gas inlet delivery ports delivering a first processing gas to the process chamber at a rate controlled by a first mass flow controller, the second gas inlet delivery ports delivering a second processing gas to the process chamber at a rate controlled by a second mass flow controller and the third gas inlet delivery ports delivering a third processing gas to the process chamber at a rate controlled by a third mass flow controller, the third process gas delivered at a flow rate of about 5-15 percent of an overall gas flow rate of the first second and third gasses.

In some embodiments, each process chamber is a thin film deposition chamber that includes controls, hardware and a plasma generation system configured to carry out chemical vapor deposition (CVD) or plasma enhanced chemical vapor deposition (PECVD) of an oxide at a process temperature of about 500-600° C.

In some embodiments, the third gas inlet delivery ports are located at about the same vertical position as an upper substrate-receiving surface of the corresponding substrate stage, the first and second gas inlet delivery ports direct gas downwardly and the third gas inlet delivery ports directs gas laterally.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

The invention claimed is:

1. A method comprising:
   providing a semiconductor substrate with a first film formed on a backside thereof, said first film including an outermost nitride layer;
   disposing said backside of said substrate on a chuck in a film deposition apparatus;
   depositing a second film on an opposed front surface of said substrate by delivering at least two gases downwardly toward said front surface of said substrate and at least a gas directed laterally toward an outer edge of said substrate, said depositing further comprising depositing said second film on a periphery of said backside of said substrate, said second film on said backside extending inwardly from said outer edge to a distance that varies equal to or less than about 15 percent around said periphery of said substrate, and
   using said second film on said backside as a mask and removing said first film from said backside of said substrate in locations other than said periphery.

2. The method as in claim 1, wherein said depositing comprises chemical vapor deposition.

3. The method as in claim 1, wherein said second film comprises an oxide.

4. The method as in claim 3, wherein said oxide comprises an STI oxide and said depositing comprises a high aspect ratio deposition process.

5. The method as in claim 1, further comprising removing said second film from said backside after said removing said first film.

6. The method as in claim 5, further comprising, after said removing said second film from said backside, depositing a third film using a further deposition process that deposits said third film on said front surface and on said periphery of said backside of said substrate.

7. The method as in claim 6, wherein said depositing a third film comprises depositing a high-k dielectric film and said depositing deposits said high-k dielectric film on no other portions of said backside of said substrate.

8. The method as in claim 6 wherein said distance includes an average of less than about 3 millimeters around said periphery and said high-k dielectric film extends inwardly from said outer edge on said backside of said substrate to an average distance of less than about 2.5 mm around said periphery of said substrate.

9. The method as in claim 1, wherein said depositing takes place in a first deposition chamber of said film deposition apparatus that includes further deposition chambers, each of said first deposition chamber and each said further deposition chamber having an exhaust port disposed centrally beneath said corresponding substrate and further comprising exhausting said first deposition chamber and said further deposition chambers through said respective exhaust ports using a common pumping system.

10. A method for depositing film on substrates, said method comprising:
providing a multi chamber film deposition apparatus with a common pumping system; and,
in each said chamber:
providing a substrate on a substrate stage, said substrate having a back surface including at least one first film thereon, said at least one first film including an outermost nitride layer,
delivering gases to said chamber through a plurality of gas delivery ports, said plurality of gas delivery ports including first gas delivery ports centrally located over said substrate, second gas delivery ports peripherally surrounding said first gas delivery ports and located above said substrate and third gas delivery ports located laterally adjacent side edges of said substrate,
exhausting said chamber using said common pumping system that exhausts said chamber through an exhaust port centrally disposed underneath said substrate stage, and
depositing a second film on a front surface and on a peripheral portion of the back surface of said substrate using said gases and chemical vapor deposition (CVD), wherein said second film is an oxide film;
using said oxide film on said peripheral portion as a mask and removing said at least one first film from said backside of said substrate in locations other than said periphery; and
removing said oxide film from said backside.

11. The method as in claim 10, wherein, in each said chamber, said oxide film on said peripheral portion extends inwardly from an outer edge of said substrate to a distance that varies equal to or less than about 15% around said peripheral portion of said back surface of said substrate.

12. The method as in claim 10, further comprising heating each said substrate and wherein said CVD comprises one of metal organic CVD (MOCVD), plasma enhanced CVD (PECVD), low pressure CVD (LPCVD), and atmospheric pressure CVD (APCVD).

13. The method as in claim 10, wherein, in each said chamber, said substrate stage includes a heater therein and said delivering includes said first gas delivery ports delivering a first gas species downwardly toward said substrate, said second gas delivery ports delivering a second gas species downwardly toward said substrate and said third gas delivery ports delivering a third gas species laterally toward said substrate.

14. The method as in claim 10, further comprising, after said removing said oxide film from said backside, depositing a high-k dielectric film using a further deposition process that deposits said high-k dielectric film on said front surface and on said peripheral portion of each said back surface of each said substrate in each said chamber.

15. The method as in claim 1, wherein said second film comprises an oxide and further comprising removing some of said oxide using an HF dip operation then removing said outermost nitride layer from said backside of said substrate in locations other than said periphery in an etching operation that also removes remaining portions of said oxide and, after said removing, depositing a third film using a further deposition process that deposits said third film on said front surface and on said periphery of said backside of said substrate.

16. A method for thin film deposition comprising:
disposing a respective substrate on a respective centrally disposed substrate stage inside each respective one of a plurality of process chambers;
in each said process chamber, delivering a first gas species downwardly through first gas inlet delivery ports centrally positioned over said substrate stage, delivering a second gas species downwardly through second gas inlet delivery ports positioned laterally around said first gas inlet delivery ports and over said substrate stage, and delivering a third gas species laterally through third gas inlet delivery ports located laterally adjacent said substrate stage, so as to deposit an oxide film on an upper surface and on a peripheral portion of an opposed lower surface of said substrate; and
exhausting each of said plurality of process chambers through a respective exhaust port and through a common exhaust conduit, each said respective exhaust port centrally disposed underneath said corresponding substrate stage,
wherein:
said upper surface and said lower surface each comprise a nitride film,
said delivering a third gas species includes delivering said third gas species through said third gas inlet delivery ports at a flow rate of about 5-15 percent of a total gas flow rate of said first second and third gas species, and
wherein said exhausting comprises using a common pumping system to exhaust each of said process chambers.

17. The method as in claim 15, further comprising removing said nitride film from said lower surface except for portions of the lower surface covered by said oxide film, removing said oxide film from said lower surface after removing said nitride film, then depositing a high-k dielectric film on said upper surface and on said peripheral portion of said lower surface only.

* * * * *